United States Patent
Pan et al.

(10) Patent No.: US 6,297,106 B1
(45) Date of Patent: Oct. 2, 2001

(54) TRANSISTORS WITH LOW OVERLAP CAPACITANCE

(75) Inventors: Yang Pan; Erzhuang Lui, both of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/307,205

(22) Filed: May 7, 1999

(51) Int. Cl.[7] .................................................. H01L 21/336
(52) U.S. Cl. ......................... 438/287; 438/287; 438/591; 438/595
(58) Field of Search ................................. 438/197, 259, 438/270, 287, 291, 296, 299, 300–303, 305, 307, 585, 591, 595

(56) References Cited

U.S. PATENT DOCUMENTS

| | | | |
|---|---|---|---|
| 5,374,575 | * 12/1994 | Kim et al. | 438/291 |
| 5,434,093 | 7/1995 | Chau et al. | 437/41 |
| 5,702,972 | * 12/1997 | Tsai et al. | 438/305 |
| 5,714,788 | * 2/1998 | Ngaoaram | 257/411 |
| 5,766,998 | 6/1998 | Tseng | 438/291 |
| 5,773,348 | 6/1998 | Wu | 438/305 |
| 5,786,255 | 7/1998 | Yeh et al. | 438/299 |
| 5,786,256 | 7/1998 | Gardner et al. | 438/305 |
| 5,864,160 | * 1/1999 | Buynoski | 257/339 |
| 5,960,270 | * 9/1999 | Misra et al. | 438/197 |
| 6,087,208 | * 7/2000 | Krivokavic et al. | 438/183 |
| 6,096,644 | * 8/2000 | Lukanc | 438/674 |

OTHER PUBLICATIONS

J.Y. Chen, "CMOS Devices and Technology for VLSI", Prentice Hall, Englewood Cliffs, NJ, c. 1990, pp. 98–101.

Wolf, "Silicon Processing for the VLSI Era", vol. 3: The Submicron MOSFET, Lattice Press, Sunset Beach, CA, c. 1995, pp. 630–635.

Ed Korczynski, "Low–k Dielectric Integration Cost Modelling", Solid State Technology, c. 1997, pp. 124–128.

* cited by examiner

*Primary Examiner*—Chandra Chaudhari
*Assistant Examiner*—Asok Kumar Sarkar
(74) *Attorney, Agent, or Firm*—George O. Saile; Rosemary L. S. Pike

(57) ABSTRACT

This invention relates to the fabrication of intergrated circuit devices and more particularly to a method for reducing the gate to drain and gate to source overlap capacitance of deep sub-micron CMOS devices, as an improved means of reducing device switching times. This is accomplished by customizing the gate insulating layer, such that the dielectric constant, K, is lower in the gate to drain and gate to source overlap regions, relative to the more centrally located gate region between the source and drain. This invention avoids the process control problems associated with using conventional post polysilicon gate oxidation as a means of lowering such overlap capacitance, particularly for the deep sub-micron regime.

29 Claims, 4 Drawing Sheets

TRANSISTORS WITH LOW OVERLAP CAPACITANCE

FIELD OF THE INVENTION

This invention relates to the fabrication of integrated circuit devices and more particularly to a method for reducing the gate to drain and gate to source overlap capacitance of deep submicron CMOS devices, as an improved means of reducing device switching times.

BACKGROUND OF THE INVENTION AND PRIOR ART

As the demand has increased for semiconductor chips that offer more functions per chip and shorter times for performing those functions, semiconductor device dimensions have been pushed deeper and deeper into the sub-micron regime. Smaller devices readily translate into more available area for packing more functional circuitry onto a single chip. Smaller devices are also inherently advantageous in terms of shorter switching times, as will now be discussed. Using CMOS FET technology as a typical example, smaller device dimensions have resulted in shorter switching times for a number of reasons. In order for a device to switch a given node on a chip from one logic level to another, the effective load capacitance, $C_l$, presented to that device must be charged or discharged through some effective resistance, $R_e$, comprised of device channel resistance and device interconnect resistance. Consequently, from basic circuit theory, it follows that switching times will tend to decrease as the values of both $R_e$ and $C_l$ are reduced. Historically, increasingly smaller device dimensions have helped to reduce $R_e$, by means of shorter device channel lengths as well as the increased freedom for using shorter interconnect lines between devices. Shorter interconnect lines and their lower, associated, cross sectional area have also helped to reduce $C_l$. More over, further reductions in $C_l$ have also resulted from the smaller PN junction capacitance and parasitic device capacitance values that are inherently available from smaller devices. Accordingly, as a result of continued reductions in device geometry, from one device generation to the next, great strides have been made in the speed performance of today's chips. However, as device dimensions have progressed deeper and deeper into the sub micron regime, the technological and manufacturing challenges for continuing such scaling efforts at acceptable rates have sharply increased. This has, in turn, prompted a number of innovative techniques for squeezing additional speed out of each succeeding generation of CMOS technology. Since the 1970's the resolution limits of optical lithography have been reduced from about 1.5 microns down to about 0.2 microns and lower. Advancements, such as shorter exposure wavelengths, variable numerical aperture exposure lenses and phase shift masks, have contributed immensely to the progress that has occurred. Likewise, anti-reflective coatings have also increasingly been incorporated into semiconductor process sequences, as a means of further enhancing critical dimension (CD) control during sub-micron photolithography steps. In addition, other techniques have been developed for pushing device speeds beyond what would, otherwise, be obtained by simply scaling device sizes down to the latest CD limits of each succeeding generation of optical lithography.

U.S. Pat. No. 5,434,093 to Chau. et. al., teaches a method for using an inverted spacer structure as a means of fabricating FET devices with channel lengths that are shorter than the minimum critical dimension, CD, that can be obtained from a given photolithography image. The gate region of the device is first photolithographically defined as a trench in an oxide layer. A second overlying layer of conformal oxide is then deposited and subsequently anistropically etched back, whereby the thicker portion of the conformal layer along the side walls of the aforementioned trench is allowed to remain as an inverted spacer structure. The inverted spacer structure effectively extends the side walls of the aforementioned trench inward to a new reduced size that is considerably less than that of the original trench. The reduced trench is then used to define a polysilicon gate that is considerably smaller than the original trench. The polysilicon gate is formed by first depositing an overlying layer of polysilicon and then using a Chemical Mechanical Polishing, CMP, step to remove the polysilicon from the top surface of the oxide surrounding the aforementioned trench. The end result is an FET gate with an associated channel length that is smaller than the minimum critical dimension, CD, of the photolithography technology that was employed.

U.S. Pat. No. 5,773,348 to Wu, teaches a method, somewhat similar to that of Chau, et. al., for forming FET devices with gate lengths that are below the minimum critical dimension, CD, that any given generation of photolithography equipment. An inverted spacer structure is used, along with additional features such as a punch through stopping ion implant layer and an amorphous silicon layer, for the FET gate electrode, which is then converted to polysilicon by subsequent high temperature annealing.

U.S. Pat. No. 5,786,256 to Gardner, et. al., also teaches a method, somewhat similar to that of Chau, et. al., for forming FEF devices with gate lengths that are below the minimum critical dimension, CD, that is resolvable by any given generation of photolithography equipment. An inverted spacer structure is also used to form the gate electrode. In addition, a second set of spacers is used as part of the process sequence for the Lightly Doped Drain, LDD, engineering of the FET device. After defining the polysilicon gate, the lateral width of the first set of spacers is subsequently reduced by using the slightly protruding periphery of the polysilicon gate as an anisotropic etch mask. The reduced width of the first set of spacers facilitates the ability of an LDD ion implant to slightly extend under the gate. A second set of spacers are then conventionally formed on the side walls of the first set of spacers, prior to source-drain ion implantation.

The above prior art was mainly focused on ways to reduce FET device switching times, by means of obtaining shorter channel lengths than would, otherwise, not be possible from a given generation of photolithography equipment. However, as previously discussed. there are other factors, such as parasitic device capacitance, that can impact device switching times. One relevant component of parasitic device capacitance that has already been a-dressed in the prior art. is gate to drain overlap capacitance, $C_{gdo}$, which is also referred to as Miller Capacitance, $C_n$. $C_{gdo}$ can be particularly significant, since its value can be effectively doubled for the frequent case of an FET device being operated in an inverter circuit. FIG. 1 shows a CMOS inverter circuit, along with a $C_{gdo}$ parasitic capacitor. The input gate voltage waveform is shown as a rapidly rising ramp from zero volts to $+V_{dd}$. The output voltage waveform is shown as a corresponding rapidly falling ramp from $+V_{dd}$ to zero volts. Accordingly, from Gauss's Law, the initial stored charge on $C_{gdo}$ is equal to $+C_{gdo}V_{dd}$ and the final stored charge on $C_{gdo}$ is equal to $-C_{gdo}V_{dd}$. Therefore the effective electrical gate input capacitance to the inverter circuit can be calculated from dividing the change in charge on $C_{gdo}$, $2C_{gdo}V_{dd}$, by the change in the input voltage, $V_{dd}$, which yields a value of $2C_{gdo}$. Therefore, the effective $C_{gdo}$ component of loading capacitance, looking into the inverter stage will actually be doubled. The above electrical effects of $G_{dgo}$, also referred to Miller Capacitance, are well known and are described in J. Y. Chen, CMOS Devices and Technology for VLSI, pp. 100–101 (Prentice Hall 1990), which is incorporated herein by reference.

Gate to drain overlap capacitance, $C_{gdo}$, along with the above electrical doubling effect of $C_{gdo}$, can have a significant impact on device switching speed. Accordingly, this has prompted a series of innovations for minimizing the relative impact of $C_{gdo}$, on switching times, as FET device technology has continued to evolve. Such innovations include the tailoring of source-drain ion implant angles and gate spacers, in order to obtain sufficient gate overlap of source-drains for maintaining low channel resistance, while still minimizing the associated $C_{gdo}$ values. In addition, efforts have also been made to minimize $C_{gdo}$, by means of a Graded Gate Oxide, GGO, process, which locally increases the gate oxide thickness in the region of gate to drain overlap. Graded Gate Oxide, GGO, processing has been accomplished, for example, by using a wet ambient at about 850 C, in order to increase a 70 A° gate oxide to about 250 A°, at the edge of the gate. The above process improvements for reducing gate to drain overlap capacitance are described in S. Wolf, Silicon Processing for the VLSI Era, Vol. 3, pp. 630–635 (Lattice Press 1995), which is incorporated herein by reference.

While various implementations of the above Graded Gate Oxide, GGO, process can help to reduce gate to drain overlap capacitance, GGO does have its own set of problems. For example, interface states generated by the reoxidation step can lead in increased hot electron related instability. Further more, the GGO process has been found to be difficult to control, particularly for deep sub micron devices. Consequently, there is a need for an alternative to the method for Graded Gate Oxide, GGO, processing, that is more compatible with device and manufacturing needs associated with the fabrication of state of the art deep sub micron devices. The present invention solves this need by providing a graded gate oxide layer that is largely graded in terms of its dielectric constant, as opposed to its thickness. Accordingly, an innovative method for forming localized regions of low dielectric constant, K, oxide in gate to drain overlap regions will now be described.

SUMMARY OF THE INVENTION

A principle object of the present invention is to provide an effective and manufacturable method for reducing the gate to drain overlap capacitance, $C_{gdo}$, of MOS transistors, over a semiconductor substrate.

Another object of the present invention is to provide a method for fabricating gate oxide layers, with a graded dielectric constant, as an improved means of minimizing gate to drain and gate to source overlap capacitance.

A further object of the invention is to provide a method for reducing gate to drain overlap capacitance, that is highly compatible with the device and manufacturing needs of state of the art CMOS technologies.

A still further and primary object of the present invention is to provide a method for locally forming a low dielectric constant, K, gate oxide for the purpose of lowering gate to drain overlap capacitance without having to resort to an undesirable Graded Gate Oxide, GGO, approach that would tend to cause reliability and process control problems, particularly for deep sub-micron devices.

These objects are achieved by a fabrication method that results in a CMOS FET device that has a gate oxide with a graded dielectric constant, K, comprising the steps of: (a) forming an oxide layer over a semiconductor substrate; (b) defining and etching out the gate region for the device; (c) depositing or growing a low K gate oxide in the gate region; (d) deposition and subsequent anisotropic etch back of an overlying silicon nitride layer for the purpose of creating nitride spacers at the side walls of the gate region; (e) removal of the aforementioned low K gate oxide, except for those portions of the gate oxide that are masked by the nitride spacers; (f) subsequent formation of a thermal gate oxide in the gate region, except for those regions that remain protected by the nitride spacers; (g) deposition of an overlying polysilicon layer followed by Chemical Mechanical Polishing, CHP, for completing the formation of the gate structure of the device; and (h) subsequent conventional formation of LDD and highly doped source-drain regions, followed by completion of conventional back end of the line processing.

This invention addresses the need for an alternative method to the Graded Gate Oxide, GGO, process, for the purpose of minimizing gate to drain and gate to source overlap capacitance. This invention addresses problems, such as: (1) The need for avoiding interface states, in the vicinity of drain depletion regions, that can lead to reliability problems during hot electron stressing, and (2) The need for a graded gate oxide structure that is more compatible with device and manufacturing needs associated with the fabrication of deep sub micron devices. The present invention solves these problems by providing a graded gate oxide layer that is largely graded in terms of its dielectric constant, as opposed to its thickness. Accordingly, an innovative method, consisting of forming localized regions of low dielectric constant, K, oxide in gate to drain overlap regions, for the purpose of reducing overlap capacitance, has been achieved.

BRIEF DESCRIPTION OF THE DRAWINGS

In the accompanying drawings for a material part of this description, there is shown.

DESCRIPTION OF THE PREFERRED EMBODIMENTS

Figure 1:
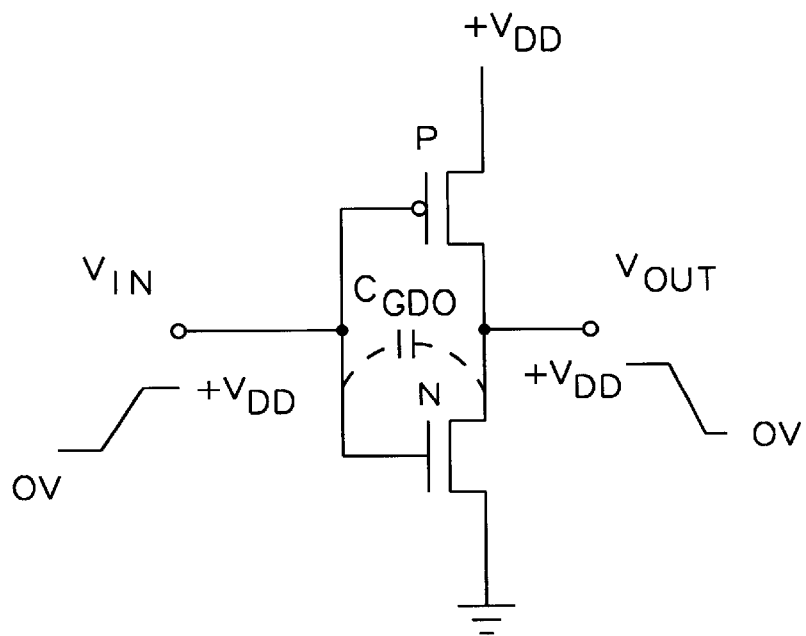
FIG. 1 shows a simplified electrical schematic of a CMOS inverter circuit, for the purpose of background discussions, regarding the effective electrical behavior of gate to drain overlap capacitance.
Figure 2:
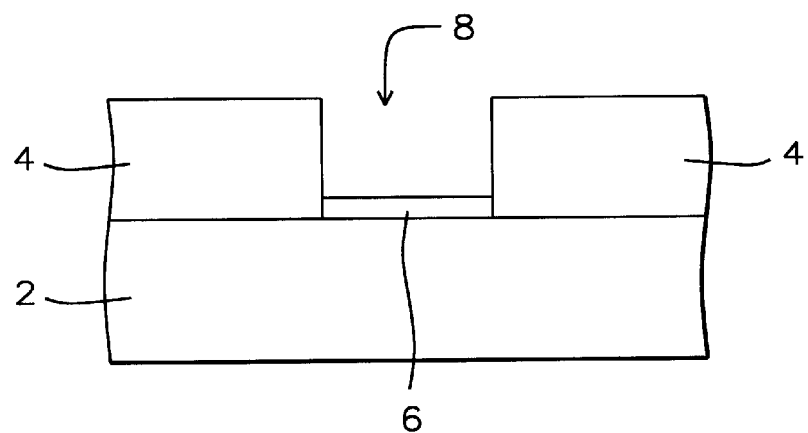
FIGS. 2, 3a, 3b, 4a, 4b, 5, 6 and 7 schematically illustrate in cross-sectional representation the preferred embodiments of the process of the present invention.

It is noted that the following preferred embodiments and associated figures are intended to be presented in a way that can be generally applied to the fabrication of N channel and/or P channel devices that could be used in either a CMOS or an NMOS, etc., technology, where reductions in gate to drain capacitance and/or gate to source capacitance are desired. However, for the purposes of discussion, the following preferred embodiments will be presented in terms of an N channel device. Referring now more particularly to FIG. 2, there is shown a portion of a partially completed integrated circuit. There is shown a semiconductor substrate 2 intended to represent a conventional ion implanted N well or P well region, in which an eventual deep sub-micron FET device will be formed. Also shown is an overlying layer of oxide 4, which has been photolithographically patterned and etched out in order to form an eventual gate region 8 for said FET device.

Continuing to refer to FIG. 2, there is also shown a thin, low K gate oxide layer 6. Said low K gate oxide layer 6 may have a typical thickness in the range between 20 and 200 angstroms and may be formed by means of a CVD method similar to those used in a backend low K dielectric process or spin on method.

Said low K gate oxide layer 6 may also be formed by means of a thermal oxide layer which is then implanted with fluorine, F, for the purpose of the reducing the dielectric constant of the thermal oxide. Said thermal gate oxide may have a typical thickness in the range of about 20 to 200 angstroms and is usually grown by means of conventional oxidation. Typical dose values for said fluorine implant are in the range of about 1E15 to 1E17 at/cm$^2$. The energy levels used for said fluorine implants are in the typical range of about 20 to 80 KeV. Said fluorine implants are usually annealed by a subsequent thermal or Rapid Thermal Anneal, RTA, process.

The typical dielectric constant, K, values that have been achieved with the aforementioned low K deposition process are in the range of about 2 to 3.5.

Figure 3A:
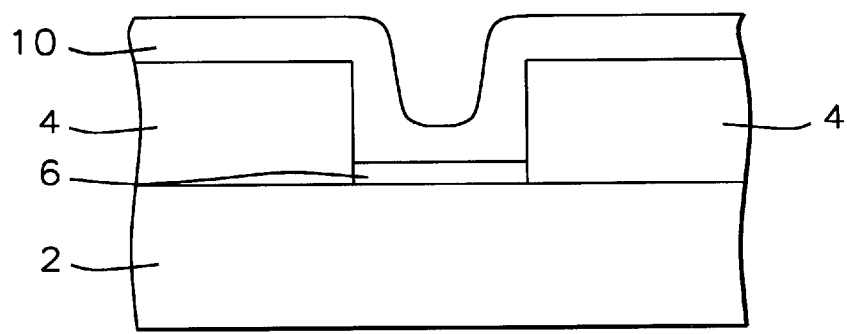

Referring now more particularly to FIG. 3a, there is shown a subsequent overlying conformal layer of silicon nitride 10 that is deposited for the purpose of eventually forming inverted spacers along the side walls of gate region 8 in said oxide layer 4. The thickness of said nitride layer 10 is typically in the range between 200 to 2000 angstroms and is usually grown by means of conventional LPCVD.

Figure 4A:
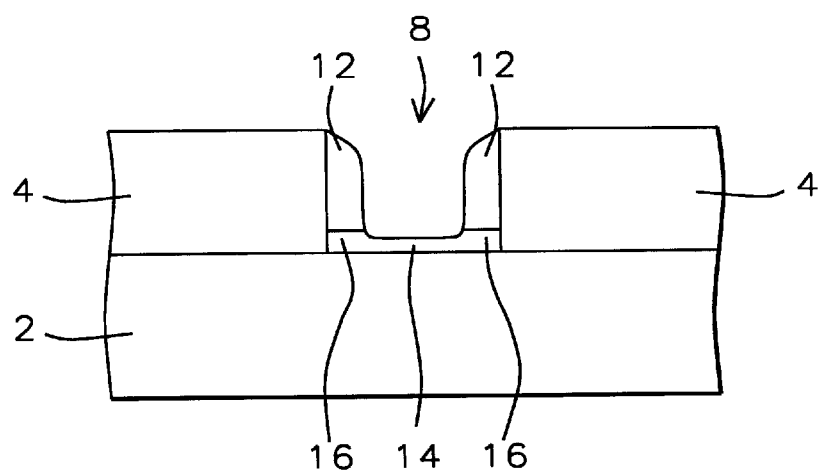

Referring now more particularly to FIG. 4a, there is shown the results of having anisotropically etched said nitride layer 10 such that it is totally removed from the top surface of said oxide layer 4 as well as being removed from a substantial portion of said low K gate oxide layer 6. It is noted that since said conformal nitride layer 10 is inherently thicker over the steps of said etched out gate region 8, it is not completely removed from the side walls of said gate region 8. Consequently, the remaining nitride on the side walls of said etched out gate region 8 results in inverted nitride spacers 12. It is noted that the end point of said anisotropic plasma etching of said nitride layer 10 is designed to guarantee the complete removal of that portion of said nitride layer 10 which resides on the surface of exposed gate oxide region 14, which is not protected by said nitride spacers 12. It is also noted that care is taken to avoid complete removal of said exposed gate oxide layer 14, during said anisotropic plasma etching, in order to avoid damaging the underlying silicon. The subsequent complete removal of said exposed gate oxide layer 14 is achieved by a wet etch processing step.

It is further noted that the portion of gate oxide layer 6, which is under said nitride spacers 12, and identified as localized low K oxide regions 16, will not be etched during said anisotropic etching. Consequently, localized low K gate oxide regions 16 will remain under said nitride spacers 12. The creation of said localized low K gate oxide regions 16 under said nitride spacers 12 is the key to this invention. Said localized low K gate oxide regions will eventually result in reduced overlap capacitance between a subsequently formed gate electrode and subsequently formed source-drain regions. Since said low K gate oxide regions 16 are protected by said nitride spacers 12, they will be able to remain in place during the eventual complete removal of unprotected gate oxide region 14. Said localized low K gate oxide regions 16 will also be well protected during the eventual growth of a conventional thermal gate oxide, in unprotected gate region 14, prior to the formation of said subsequent gate electrode and said subsequent source-drain regions.

Although it is usually desirable to only allow that portion of low K dielectric to remain, which is protected by said nitride spacers 12, there may be situations where it is also desirable to allow said low K dielectric to laterally extend to greater distances. For such cases, an alternate preferred embodiment may be used, whereby the aforementioned steps, illustrated in FIGS. 3a and 4a, are replaced by the following steps, illustrated in FIGS. 3b and 4b.

Figure 3B:
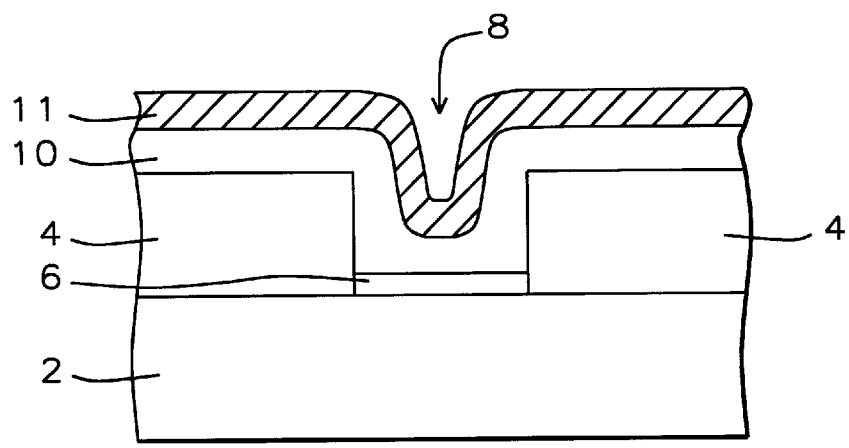

Referring now more particularly to FIG. 3b, as an alternative preferred embodiment to the aforementioned structure of FIG. 3a, there is shown a subsequent overlying conformal layer of silicon nitride 10 and a further overlying layer of polysilicon 11 that are deposited for the purpose of eventually forming double, inverted spacers along the side walls of said gate region 8 in said oxide layer 4. The thickness of said nitride layer 10 is typically in the range between 200 to 2000 angstroms and is usually grown by means of conventional LPCVD. The thickness of said polysilicon layer 11 is adjusted, according to the desired increased degree for laterally extending said low K dielectric into the channel region.

Figure 4B:
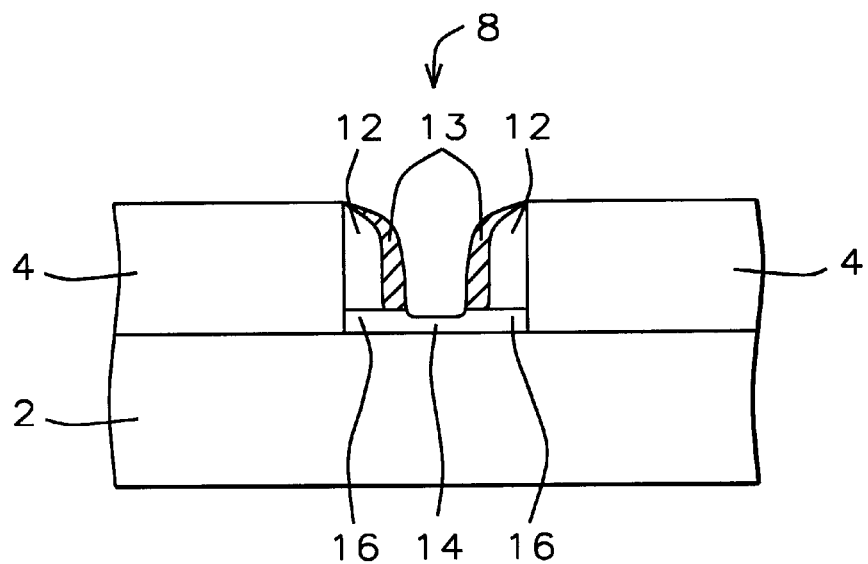

Referring now more particularly to FIG. 4b, as an alternative preferred embodiment to the aforementioned structure of FIG. 4a, there is shown the results of having anisotropically etched said nitride layer 10 and said polysilicon layer 11 such that they are totally removed from the top surface of said oxide layer 4 as well as from a substantial portion of said low K gate oxide layer 6. It is noted that since said conformal nitride layer 10 and polysilicon layer 11 are inherently thicker over the steps of said etched out gate region 8, they are not completely removed from the side walls of said gate region B. Consequently, the remaining nitride and polysilicon on the side walls of said etched out gate region 8 result in inverted nitride spacer 12 and inverted polysilicon spacer 13. It is noted that the end point of said anisotropic plasma etching is designed to guarantee the complete removal of those portions of said nitride layer 10 and polysilicon layer 11 which reside on the surface of exposed gate oxide region 14, which is not protected by said double nitride/polysilicon spacers 12 and 13. It is also noted that care is taken to avoid complete removal of said exposed gate oxide layer 14, during said anisotropic plasma etching, in order to avoid damaging the underlying silicon. The subsequent complete removal of said exposed gate oxide layer 14 is achieved by a wet etch processing step. As previously noted, said protected localized gate oxide region 16, which is under said double nitride/polysilicon spacers 12 and 13, will not be etched during said anisotropic etching. Consequently, localized low K gate oxide regions 16 will remain under said nitride/polysilicon spacers 12 and 13. As in the case of the preferred embodiments, illustrated in FIGS. 3a and 4a, the creation of said localized low K gate oxide regions 16 under said nitride/polysilicon spacers 13 is the key to this invention. Said localized low K gate oxide regions will eventually result in reduced overlap capacitance between a subsequently formed gate electrode and subsequently formed source-drain regions. Since said low K gate oxide regions 16 are protected by said nitride/polysilicon spacers 12 and 13, they will be able to remain in place during the eventual complete removal of unprotected gate oxide region 16. Said localized low K gate oxide regions 16 will also be well protected during the eventual growth of a conventional thermal gate oxide, in unprotected gate region 14, prior to the formation of said subsequent gate electrode and said subsequent source-drain regions.

With regard to the above alternate preferred embodiments, illustrated in FIGS. 3b and 4b, it is noted that by suitable adjustment of the thickness values and associated etching conditions for said nitride/polysilicon spacers, one may more easily decide on how much of the low K dielectric will remain in gate region 8, prior to said eventual growth of a conventional thermal gate oxide. It is further noted that after said eventual growth of thermal oxide, said polysilicon portion of said nitride/polysilicon spacers is subsequently removed by means of a selective plasma etching step.

For the sake of discussion, the description of the preferred embodiments will now continue from the preferred embodiments of FIGS. 1,2,3a and 4a. However, it is assumed that the following description of the preferred embodiments could also be continued from the alternate preferred embodiments of FIGS. 1,2, 3b and 4b, by those skilled in the art.

Figure 5:
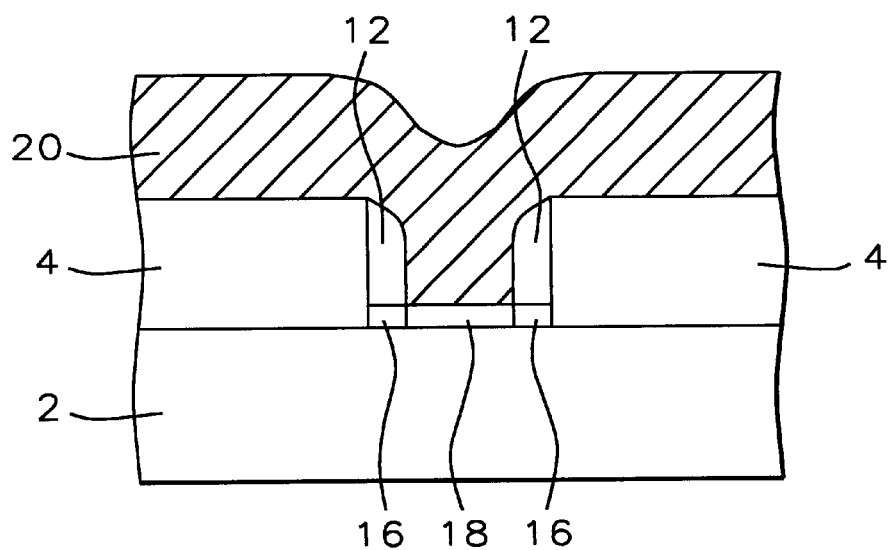

Referring now more particularly to FIG. 5, a conventional thermal gate oxide 18 is grown in said exposed gate region 14, of FIG. 4a which is not protected by said nitride spacers 12. The thickness of said thermal gate oxide is typically in a range between about 20 and 100 angstroms and is usually grown by means of thermal oxidation. Continuing to refer to FIG. 5, an overlying layer of polysilicon 20 is subsequently deposited, in order to eventually form a gate electrode. The thickness of said polysilicon layer 20 is typically in the range of 1000 to 4000 angstroms and is usually grown by means of LPCVD.

Figure 6:
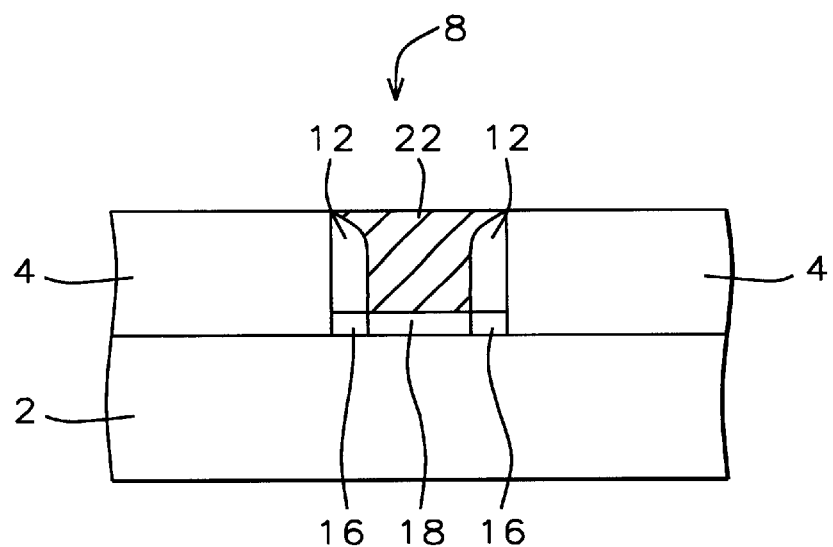

Referring now more particularly to FIG. 6, a chemical mechanical polishing, CMP, step is used to remove that portion of said polysilicon layer 20 which was situated on the surface of said oxide layer 4. The remaining polysilicon in said gate region 8 has now been formed into polysilicon gate electrode 22.

Figure 7:
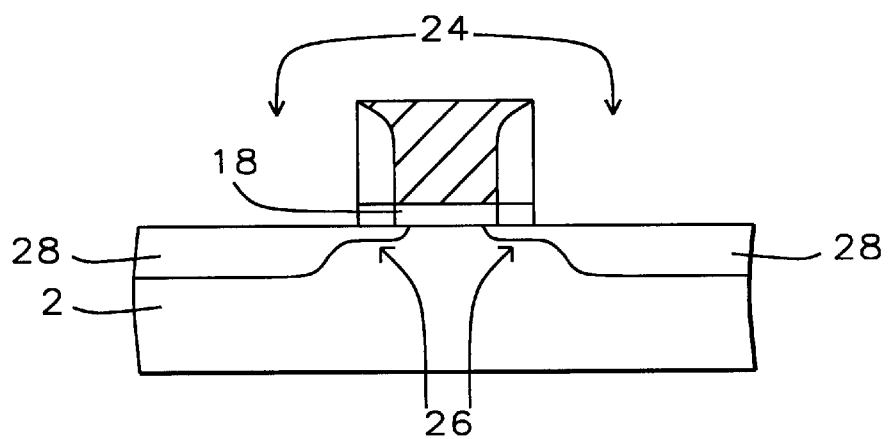

Referring now more particularly to FIG. 7, there is shown the result of subsequent conventional processing for the completion of said N channel device, of the structure of FIG. 6. There is shown the result having formed conventional source-drain contact regions 24 for the N channel device as well as the result of having formed conventional LDD regions 26, along with conventional N$^+$ source-drain regions 28.

The objects of the invention have now been accomplished. An improved alternative to the Graded Gate Oxide, GGO, process, for the purpose of minimizing gate to drain and gate to source overlap capacitance, has been presented. The aforementioned problems associated with the GGO process have been avoided by the present invention, which provides a graded gate oxide layer that is largely graded in terms of its dielectric constant, as opposed to its thickness. Accordingly, an innovative method, consisting of forming said localized regions 16 of low dielectric constant, K, oxide in gate to drain overlap regions, for the purpose of reducing overlap capacitance, has been achieved.

While the invention has been particularly shown and described with reference to the preferred embodiments thereof, it will be understood by those skilled in the art that various changes in form and details may be made without departing from the spirit and scope of the invention.

What is claimed is:

1. A method for forming localized regions of low dielectric constant, K, (where K=<3.5) oxide in gate to drain overlap regions, for the purpose of reducing overlap capacitance, comprising the steps of:

(a) forming a first oxide layer over a semiconductor substrate;

(b) patterning and etching out said first oxide layer in order to define an eventual gate region;

(c) depositing or growing a thin low dielectric constant, K, gate oxide on the silicon surface, corresponding to said eventual gate region;

(d) forming one or more inverted spacers on the side walls of said etched out gate region within said first oxide layer;

(e) removing that portion of said low K gate oxide, which is not protected by said spacers, thereby exposing the underlying silicon surface while still allowing localized regions of said low K gate oxide to remain under said spacers;

(f) growing a conventional thermal gate oxide on said exposed silicon surface, in order to complete the creation of a gate oxide layer with a graded dielectric constant; and (g) subsequent formation of a conventional polysilicon gate structure, along with the formation of conventional source-drain contacts as well as implanted LDD regions and implanted N+ source-drain regions.

2. The method of claim 1 wherein said inverted spacers are comprised of insulators, polysilicon, or a double insulator/polysilicon spacer combination, thereof.

3. The method of claim 1 wherein the thickness of said low K gate oxide layer is between about 20 to 200 angstroms.

4. The method of claim 1 wherein said low K gate oxide is formed by means of depositing a low K dielectric layer or by the implantation of fluorine into a thermal gate oxide layer.

5. The method of claim 1 wherein said insulating spacers are comprised of materials selected from the group consisting of silicon nitride or silicon oxynitride.

6. The method of claim 1 wherein the thickness of said thermal gate oxide layer is between about 20 and 100 angstroms.

7. A fabrication method for forming a deep sub-micron CMOS FET device with localized regions of low dielectric constant, K, oxide (where K=<3.5) in gate to drain and gate to source overlap regions, for the purpose of reducing overlap capacitance, comprising the steps of:

(a) depositing a first oxide layer over a semiconductor substrate;

(b) patterning and etching out said first oxide layer in order to define an eventual gate region;

(c) depositing or growing a thin low dielectric constant, K, gate oxide on the silicon surface, corresponding to said eventual gate region;

(d) depositing an overlying silicon nitride layer and subsequently anisotropically etching back said nitride layer to form nitride spacers on the side walls of said gate region within said first oxide layer;

(e) etching out that portion of said low K gate oxide, which is not protected by said nitride spacers, thereby exposing the underlying silicon surface while still allowing localized regions of said low K gate oxide to remain under said nitride spacers;

(f) growing a conventional thermal gate oxide on said exposed silicon surface, in order to complete the creation of a gate oxide layer with a graded dielectric constant;

(g) depositing an overlying layer of polysilicon and then using a chemical mechanical polishing, CMP, process to polish back said polysilicon layer for the purpose of forming gate electrodes;

(h) subsequent formation of conventional source-drain contacts, along with implanted N type LDD regions and implanted N$_+$ source-drain regions as well as the doping and silicidation of said polysilicon gate electrodes.

8. The method of claim 7 where said nitride spacers are a double spacer structure comprised of an inverted silicon nitride spacer and a juxtaposed inverted polysilicon spacer.

9. The method of claim 7 wherein the thickness of said first insulating oxide layer is between about 1000 to 4000 angstroms.

10. The method of claim 7 wherein said first oxide layer is formed by means of CVD or thermal processing.

11. The method of claim 7 wherein the thickness of said low K gate oxide layer is in a range of about 20 to 200 angstroms.

12. The method of claim 7 wherein the deposition of said low K gate oxide layer is performed by means of CVD, thermal or spin on processing.

13. The method of claim 7 wherein a process for forming a low K gate oxide is by means of: (a) A CVD method similar to those used in backend low K dielectric processes, (b) or a spin-on method or (c) even a normal oxide growth followed by ion implantation of fluorine.

14. The method of claim 7 wherein the process for forming said nitride spacers consists of:

(a) depositing a CVD layer of silicon nitride; and (b) using an anisotropic plasma etch for etching back said nitride layer.

15. The method of claim 8 wherein the process for forming said alternative double nitride/polysilicon spacers consists of:

(a) depositing a CVD layer of silicon nitride;

(b) depositing an overlying layer of polysilicon;

(c) using an anisotropic plasma etch for etching back said nitride and polysilicon layers.

16. The method of claim 14 wherein the thickness of said nitride layer is in the range of about 200 to 2000 angstroms.

17. The method of claim 14 wherein the CVD plasma etching is used for etching back said nitride layer.

18. The method of claim 14 wherein the etch stopping method for anisotropically etching back said nitride layer is based on the etching selectivity between the nitride and the low K dielectric material.

19. The method of claim 14 wherein the typical width of said nitride spacers is in the range of about 200 to 2000 angstroms.

20. The method of claim 7 wherein the etching out of that portion of said low K gate oxide, which is not protected by said overlying nitride spacers, is performed by means of a plasma etch followed by a wet etch.

21. The method of claim 7 wherein the thickness of said gate oxide is in a range of about 20 to 200 angstroms.

22. The method of claim 7 wherein the thickness of said polysilicon layer that is used for forming said gate electrode is in a range of about 1000 to 4000 angstroms.

23. The method of claim 7 wherein the typical dielectric constant value values for said low K portion of the gate oxide that resides under said nitride spacers is in a range of about 2 to 3.5.

24. The method of claim 7 wherein the dose of said N type LDD implant is typically in a range of about 1E13 to 5E14 atoms/$cm^2$.

25. The method of claim 7 wherein the energy for said N type LDD implant is in a typical range of about 20 to 100 KeV.

26. The method of claim 7 wherein the dose of said $N_+$ source-drain implant is typically in a range of about 1E15 to 8E15 atoms/$cm^2$.

27. The method of claim 7 wherein the energy for said $N^+$ source-drain implant is in a typical range of about 20 to 100 KeV.

28. The method of claim 8 wherein the nitride thickness for said double spacer is between about 200 and 2000 angstroms.

29. The method of claim 8 wherein the polysilicon thickness for said double spacer structure is adjusted for increasing the degree to which the low K gate dielectric is laterally extended into the channel region.

* * * * *